United States Patent
Kawaguchi et al.

(10) Patent No.: US 6,563,193 B1
(45) Date of Patent: May 13, 2003

(54) SEMICONDUCTOR DEVICE

(75) Inventors: Yusuke Kawaguchi, Miura-gun (JP);
Kazutoshi Nakamura, Yokohama (JP);
Tomoko Matsudai, Tokyo (JP);
Hirofumi Nagano, Yokohama (JP);
Akio Nakagawa, Hiratsuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/670,548

(22) Filed: Sep. 27, 2000

(30) Foreign Application Priority Data

Sep. 28, 1999 (JP) ............................. 11-274001
Sep. 29, 1999 (JP) ............................. 11-277454

(51) Int. Cl.$^7$ .................. H01L 27/082; H01L 27/102; H01L 29/70; H01L 31/11
(52) U.S. Cl. ...................... 257/575; 257/577; 438/335
(58) Field of Search ................. 257/197, 273, 257/571, 577, 585, 593, 598, 409, 487, 347, 355, 387, 590, 592, 423, 556, 575, 565

(56) References Cited

U.S. PATENT DOCUMENTS

| | | | | |
|---|---|---|---|---|
| 4,901,132 A | * | 2/1990 | Kuwano ...................... 357/43 |
| 5,181,091 A | * | 1/1993 | Harrington, III et al. ... 257/355 |
| 5,347,156 A | * | 9/1994 | Sakaue ........................ 257/575 |
| 5,391,908 A | * | 2/1995 | Walker et al. .............. 257/409 |
| 5,592,015 A | * | 1/1997 | Iida et al. ..................... 257/524 |
| 5,608,236 A | * | 3/1997 | Arakawa et al. ............. 257/123 |
| 5,665,634 A | * | 9/1997 | Beasom ....................... 438/404 |
| 5,665,988 A | * | 9/1997 | Huang ......................... 257/133 |
| 5,801,420 A | * | 9/1998 | Fujishima ................... 257/343 |
| 6,008,512 A | * | 12/1999 | Beasom ....................... 257/248 |

FOREIGN PATENT DOCUMENTS

JP   359158554 A   *  9/1984

OTHER PUBLICATIONS

Hideyuki Funaki, et al., "High Voltage BiCDMOS Technology on Bonded 2μm SOI Integrating Vertical npn pnp, 60V–LDMOS and MPU, Capable of 200° C. Operation," IEDM Tech. Digest, 1995, pp. 967–970.

Rupit Patel, et al., "A 30V Complementary Bipolar Technology on SOI for High Speed Precision Analog Circuits," BCTM Proceedings, 1997, pp. 48–50.

* cited by examiner

*Primary Examiner*—Long Pham
*Assistant Examiner*—Dana Farahani
(74) *Attorney, Agent, or Firm*—Oblon, Spivak, McClelland, Maier & Neustadt, P.C.

(57) ABSTRACT

A semiconductor device comprises a substrate the surface of which is formed of an insulation region, a high resistance active layer of a first conductivity type formed on the substrate, a first semiconductor region of the first conductivity type having an impurity concentration higher than that of the active layer and selectively formed on a surface of the active layer, an emitter region of the second conductivity type selectively formed on a surface of the semiconductor region, a collector region of the second conductivity type selectively formed on a surface of the active layer, and a base contact region of the first conductivity type selectively formed on a surface of the active layer in separation from the emitter region and the collector region, respectively. When an inversion layer is formed at an interface between the insulation region and the active layer due to the voltage of the substrate, the semiconductor region suppresses an emitter current flowing via the inversion layer thereby allowing the emitter current to flow on the surface side of the active layer.

23 Claims, 9 Drawing Sheets

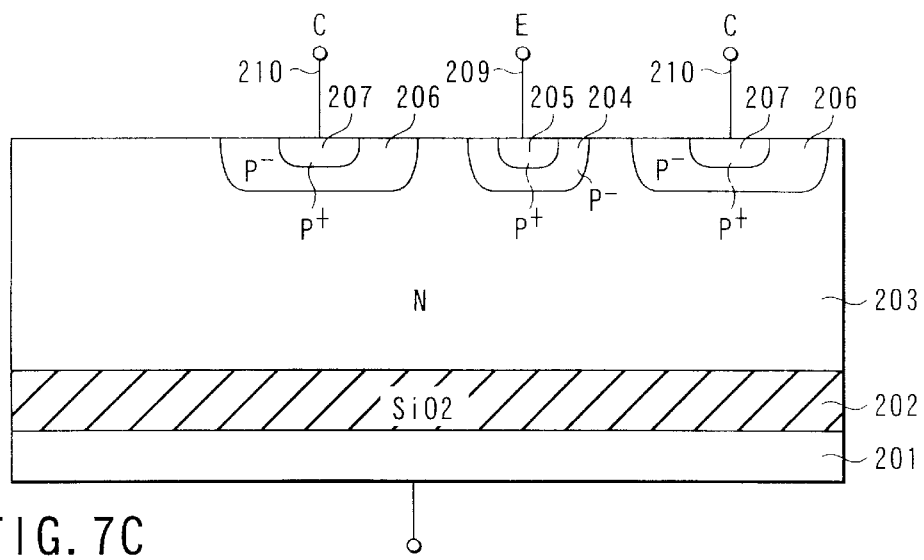
FIG. 7C
| | Vcbo (V) | Vceo (V) | EARLY VOLTAGE (V) |
|---|---|---|---|
| PRIOR ART | 93.7 | 43.3 | 21.3 |
| PRESENT INVENTION | 89.7 | 62 | 51.6 |
FIG. 8
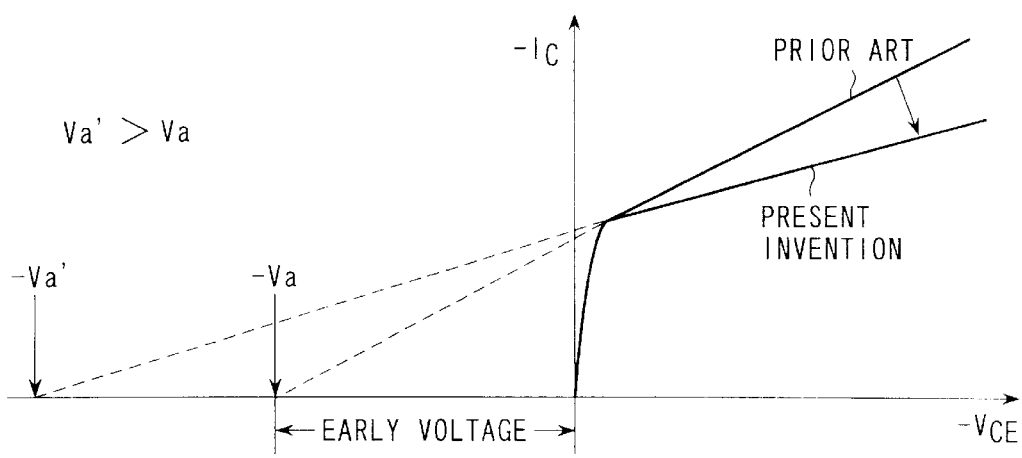
FIG. 9

SEMICONDUCTOR DEVICE

CROSS-REFERENCE TO RELATED APPLICATIONS

This application is based upon and claims the benefit of priority from the prior Japanese Patent Applications No. 11-274001, filed Sep. 28, 1999; and No. 11-277454, filed Sep. 29, 1999, the entire contents of which are incorporated herein by reference.

BACKGROUND OF THE INVENTION

The present invention relates to a semiconductor device, and more particularly to a high voltage lateral bipolar transistor which is suitable for the incorporation into an integrated circuit.

Conventionally, a lateral bipolar transistor is formed on an SOI (silicon on insulator) so that a high voltage semiconductor device is formed. FIGS. 1A and 1B are a plan view and a sectional view showing such conventional lateral bipolar transistors.

As shown in FIGS. 1A and 1B, a buried oxide layer 52 is formed on a semiconductor substrate 51 on which a high-resistance n-type active layer 53 is formed. On a surface of the n-type active layer 53, an n-type diffusion layer 56 is formed. On the surface of this n-type diffusion layer 56, a low-resistance base contact layer 58, a p-type collector layer 59 and a p-type emitter layer 57 are selectively formed respectively. A base electrode 62b is formed on the n-type base contact layer 58, a collector electrode 62c is formed on the p-type collector layer 59, and an emitter electrode 62a is formed on the p-type emitter layer 57, respectively.

Incidentally, reference numeral 60a denotes a LOCOS (local oxidation of silicon) film. Reference numeral 60b denotes a thermal oxide film. On these oxide films, an insulation film 61 is formed. On the n-type active layer 53, a trench 53a is formed. In this trench 53a, a polycrystal silicon layer 55 is buried via the insulation layer 54 so that an isolation region is formed.

With the lateral bipolar transistor having such a structure, an impurity distribution of the n-type diffusion layer 56 forms a profile so that the concentration is high on the surface thereof, and the concentration becomes low as the depth becomes deeper. As a consequence, the current density injected from the p-type emitter layer 57 becomes high at the portion deeper than the surface portion.

Consequently, in the case where the potential of the semiconductor substrate 51 is changed with respect to the n-type active layer 53, for example, when the potential of the semiconductor substrate 51 becomes a negative value with respect to the n-type active layer 53, there arises a problem that a p-type inversion layer is formed on an interface between the buried oxide film 52 and the n-type active layer 53, and a resistance of the current channel of the hole current is remarkably lowered with the result that the characteristic such as hFE or the collector current dependency on the voltage between the emitter and the collector depends on the potential of the semiconductor substrate 51.

By the way, in order to improve the breakdown voltage of the conventional PNP-type lateral bipolar transistor, a depletion layer is widened to the base side generally by lowering an impurity concentration in the base region to reduce an electric field. However, the following problem is generated when the impurity concentration in the base region is lowered. That is, there arises a problem that the base width modulation effect is conspicuously generated wherein the base width is gradually decreased with an electric field from the collector side so that the gain is changed, with the result that the Early voltage is lowered. For example, the deterioration in the circuit performance occurs when an analog circuit is formed of transistors having a low Early voltage. As one example, there can be given a fact that the gain is lowered when a transistor which has a low Early voltage is used in a comparator. Incidentally, the Early voltage will be described later, but the Early voltage is a voltage value at a point where an abscissa intersects a straight line extended from the straight line of the collector current in the active region when the voltage between the collector and emitter is assigned to an abscissa and a collector current is assigned to an ordinate of a graph.

BRIEF SUMMARY OF THE INVENTION

A first object of the present invention is to provide a structure of a semiconductor device wherein the characteristic such as hFE or the like does not depend on the potential of the semiconductor substrate.

A second object of the present invention is to provide a lateral bipolar transistor having a high Early voltage wherein the base width modulation effect is suppressed while a breakdown voltage is maintained.

In order to attain the above object, the semiconductor device according to a first aspect of the invention comprises:

a substrate a surface of which is formed of an insulation region;

a high resistance active layer of a first conductivity type formed on the surface of the substrate;

a semiconductor region of the first conductivity type having an impurity concentration higher than that of the active layer of the first conductivity type and selectively formed on a surface of the active layer of the first conductivity type;

an emitter region of a second conductivity type selectively formed on the semiconductor region of the first conductivity type;

a collector region of the second conductivity type selectively formed on the surface of the active layer of the first conductivity type in separation from the semiconductor region of the first conductivity type; and a base contact region of the first conductivity type selectively formed on the surface of the active layer of the first conductivity type in separation from the emitter region and the collector region.

The semiconductor device according to a second aspect of the present invention comprises:

a substrate a surface of which is formed of an insulation region;

a high resistance active layer of a first conductivity type formed on the surface of the substrate;

a first semiconductor region of the first conductivity type having an impurity concentration higher than that of the active layer of the first conductivity type and selectively formed on a surface of the active layer of the first conductivity type;

an emitter region of a second conductivity type selectively formed on the surface of the first semiconductor region of the first conductivity type;

a collector region of the second conductivity type selectively formed on the surface of the active layer of the first conductivity type in separation from the first semiconductor region of the first conductivity type;

a second semiconductor region of the first conductivity type having an impurity concentration higher than of the active layer of the first conductivity type, and formed on the active layer of the first conductivity type in separation from the semiconductor region of the first conductivity type; and a base contact region of the first conductivity type selectively formed on the surface of the second semiconductor region of the first conductivity type.

Furthermore, according to a third aspect of the present invention, the semiconductor device comprises:

a substrate a surface of which is formed of an insulation region;

a high resistance active layer of a first conductivity type formed on the surface of the substrate;

a semiconductor region of the first conductivity type having an impurity concentration higher than that of the active layer of the first conductivity type and selectively formed on a surface of the active layer of the first conductivity type;

an emitter region of a second conductivity type and a base contact region of a first conductivity type formed in separation from each other on the surface of the active layer of the first conductivity type; and a collector region of the second conductivity type selectively formed on the surface of the active layer of the first conductivity type in separation from the semiconductor region of the first conductivity type.

It is desirable that the semiconductor device according to the first to third aspects of the present invention is constituted in the following manner.

(1) The first semiconductor region of the first conductivity type and the second semiconductor region of the first conductivity type are constituted substantially in the same depth, and substantially in the same surface impurity concentration.

(2) The depth of the semiconductor region of the first conductivity type is smaller than the thickness of the active layer of the first conductivity type.

(3) The depth of the semiconductor region of the first conductivity type is 1 $\mu$m or more.

(4) The surface impurity concentration in the semiconductor region of the first conductivity type is $5 \times 10^{15}$ cm$^{-3}$ or more and $5 \times 10^{16}$ cm$^{-3}$ or less.

(5) The thickness of the active layer of the first conductivity type is 10 $\mu$m or less.

(6) The breakdown voltage between the emitter region and the collector region is 10V or more and 80V or less.

(7) The emitter region is surrounded by the collector region excluding a portion between the base contact region and the emitter region.

According to the present invention, even in the case where an inversion layer is formed due to a voltage of the substrate on an interface surface of the active layer of the first conductivity type which contacts the insulation region, an emitter current which flows via the inversion layer is suppressed by the semiconductor region of the first conductivity type formed under the emitter region. As a consequence, the emitter current is allowed to flow on the surface side of the active layer of the first conductivity type. Therefore, the resistance of this current channel can be prevented from remarkably lowering, which results from the flow of the hole current via the inversion layer, with the result that it becomes possible to suppress the problem that the characteristic of hFE or the like depends on the potential of the semiconductor substrate.

According to a fourth aspect of the present invention, the semiconductor device comprises:

a semiconductor region of a first conductivity type formed on a substrate;

an emitter region of a second conductivity type and a collector region of the second conductivity type selectively formed on a surface of a semiconductor region;

a base contact region of the first conductivity type selectively formed on the surface of the semiconductor region of the first conductivity type in separation from the emitter region of the second conductivity type and the collector region of the second conductivity type; and a first semiconductor region of the second conductivity type having an impurity concentration lower than that of the collector region of the second conductivity type, and formed between the collector region of the second conductivity type and the emitter region of the second conductivity type in contact with the collector region of the second conductivity type in separation from the emitter region of the second conductivity type.

According to a fifth aspect of the present invention, the semiconductor device comprises:

a semiconductor region of a first conductivity type formed on a substrate;

an emitter region of a second conductivity type and a collector region of the second conductivity type selectively formed on a surface of the semiconductor region;

a base contact region of the first conductivity type selectively formed on a surface of the semiconductor region of the first conductivity type in separation from the emitter region of the second conductivity type and the collector region of the second conductivity type; and a first semiconductor region of a second conductivity type having an impurity concentration lower than that of the collector region of the second conductivity type, and formed in contact with a portion of the collector region of the second conductivity type located opposite to the emitter region of the second conductivity type and in separation from the emitter region of the second conductivity type.

It is desirable that the semiconductor device according to the fourth and the fifth aspects of the present invention is constituted in the following manner.

(1) The first semiconductor region of the second conductivity type is formed also on a portion located opposite to the base contact region of the first conductivity type in contact with the collector region of the second conductivity type, and this first semiconductor region of the second conductivity type is separated from the base contact region of the first conductivity type.

(2) The second semiconductor region of the second conductivity type which has an impurity concentration lower than that of the emitter region of the second conductivity type is provided such that the region contacts a portion opposite to the collector region of the second conductivity type in the emitter region of the second conductivity type and is formed in separation from the collector region of the second conductivity type.

(3) The second semiconductor region of the second conductivity type is also formed on a portion located opposite to the base contact region of the first conductivity type in the emitter region of the second conductivity type, and the second semiconductor region of the second conductivity type is separated from the base contact region of the first conductivity type.

(4) There are provided a source region of a second conductivity type and a drain region of the second conductivity type selectively formed in separation from each other on a surface of the active region of the first conductivity type provided on the same substrate on which the semiconductor region of the first conductivity type is formed; a third semiconductor region of the second conductivity type having a concentration lower than the concentration of the drain region of the second conductivity type, the region being formed in separation from the source region of the second conductivity type and in contact with the drain region of the second conductivity type and including a portion between the source region of the second conductivity type and the drain region of the second conductivity type, and a gate electrode formed via a gate insulation film on the surface of the active layer of the first conductivity type sandwiched between the third semiconductor region of the second conductivity type and the source region of the second conductivity type.

(5) A collector region of the second conductivity type is formed so as to surround the emitter region of the second conductivity type excluding a portion between the base contact region of the first conductivity type and the emitter region of the second conductivity type.

(6) The semiconductor region of the first conductivity type is formed on the substrate via the insulation region.

(7) The net dose of the second semiconductor region of the second conductivity type is $4.0 \times 10^{12}$ cm$^{-2}$ or less.

(8) The net dose of the first semiconductor region of the second conductivity type is $4.0 \times 10^{12}$ cm$^{-2}$ or less.

(9) The net dose of the third semiconductor region of the second conductivity type is $4.0 \times 10^{12}$ cm$^{-2}$ or less.

According to the present invention, in a lateral bipolar transistor (for example, PNP-type transistor), the depletion layer is expanded toward the collector side to maintain the breakdown voltage instead of being expanded toward the base side like the conventional transistor, thereby reducing the electric field. For this purpose, a semiconductor region of a second conductivity type is formed, which has a concentration lower than the concentration of the collector region of the second conductivity type. Within such a semiconductor region of the second conductivity type, the depletion layer is expanded from an interface with the base region, so that breakdown voltage can be secured in this semiconductor region of the second conductivity type. Consequently, since the impurity concentration of the base region can be increased, the expansion of the depletion layer in the base region can be suppressed with the result that the base width modulation effect resulting from the decrease in the base width can be suppressed and the Early voltage can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7C is a sectional view taken along the line 7C—7C of FIG. 7A.

FIG. 8 is a diagram in which the characteristic of the conventional semiconductor device is compared with the characteristic of the semiconductor device according to the present invention by simulation.

FIG. 9 is a characteristic diagram showing a comparison between the Early voltage of the conventional semiconductor device and the Early voltage of the semiconductor device according to the present invention.

DETAILED DESCRIPTION OF THE INVENTION

Figure 1A:
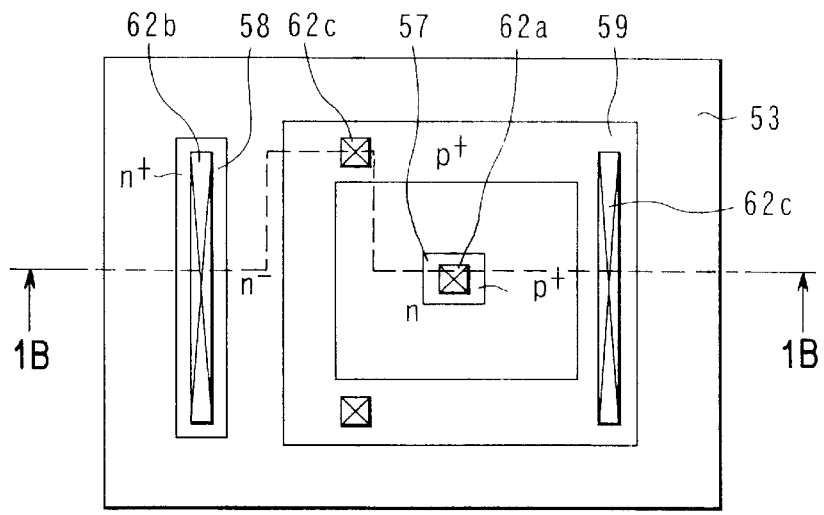
FIG. 1A is a plan view of a conventional lateral bipolar transistor.

Embodiments of the present invention will be explained by referring to the drawings of the present invention.

FIRST EMBODIMENT

Figure 2A:
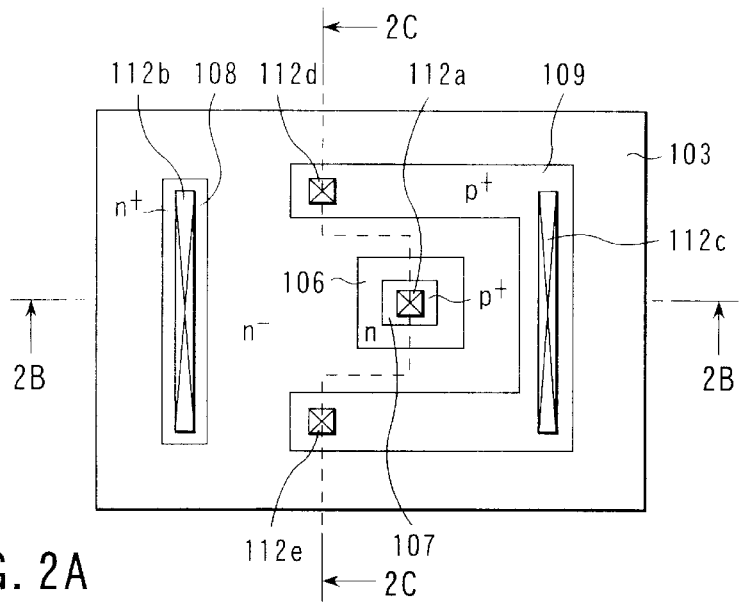
FIG. 2A is a plan view of a semiconductor device according to a first embodiment of the present invention.
Figure 2B:
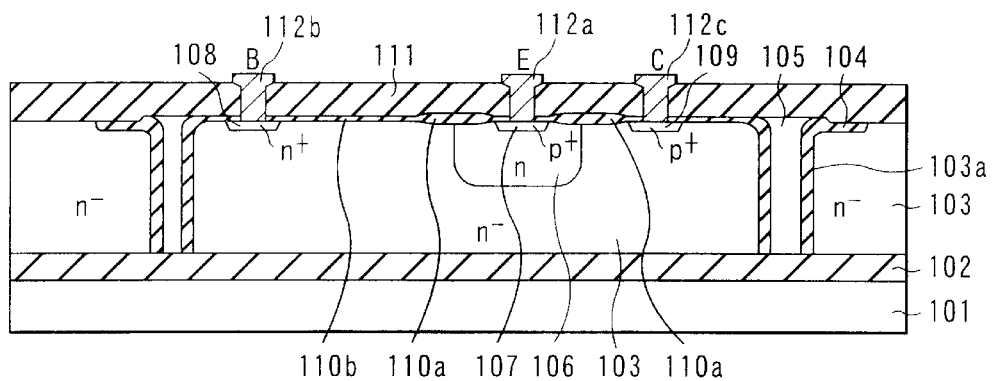
FIG. 2B is a sectional view taken along the line 2B—2B of FIG. 2A.
Figure 2C:
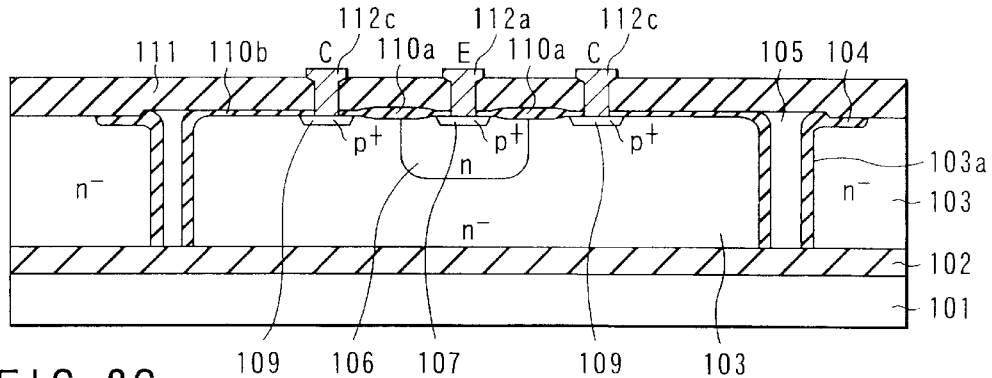
FIG. 2C is a sectional view taken along the line 2C—2C of FIG. 2A.

FIGS. 2A through 2C are views showing a structure of a semiconductor device according to a first embodiment of the present invention. A lateral bipolar transistor is formed on an SOI substrate.

Specifically, a buried oxide film 102 is formed on a semiconductor substrate 101. On the semiconductor substrate 101, a high resistance n-type active layer 103 is formed. On the surface of the n-type active layer 103, an n-type diffusion layer 106 is formed. On the surface of this n-type diffusion layer 106, a p-type emitter layer 107 is selectively formed. Furthermore, on the surface of the n-type active layer 103, a low-resistance n-type base contact layer 108, and a p-type collector layer 109 are selectively formed respectively in separation from the n-type diffusion layer 106. As can be seen from FIG. 2A, the p-type collector layer 109 is formed in such a manner that the layer 109 surrounds the circumference of the p-type emitter layer 107 excluding a portion between the n-type base contact layer and the p-type emitter layer 107. In such a pattern structure, the base current becomes hardly affected by the potential resulting from the p-type collector layer 109 between the n-type base contact layer 108 and the p-type emitter layer 107 with the result that a considerably favorable transistor characteristic can be obtained.

Furthermore, a base electrode 112b is formed on the n-type base contact layer 108, collector electrodes 112c, 112d, and 112e are formed on the p-type collector layer 109, and an emitter electrode 112a is formed on the p-type emitter layer 107, respectively. The collector electrodes 112d and 112e are both provided on a portion in the vicinity of the n-type base contact layer 108 with the result that the contact resistance of the collector can be decreased.

Incidentally, reference numeral 110a denotes a LOCOS oxide film, and reference numeral 110b denotes a thermal oxide film. On these oxide films, an insulation film 111 is formed. On the n-type active layer 103, a trench 103a is formed and a polycrystalline silicon layer 105 is buried in this trench 103a via the insulation film 104, thereby forming an isolation region.

As has been described above, in the first embodiment, the n-type diffusion layer 106 is selectively formed on the surface of the n-type active layer 103 in such a manner that the layer surrounds the n-type emitter layer 107. On the other hand, in the conventional technology, as shown in FIG. 1B, the n-type active layer 56 is formed on a wide region including the collector layer 59, the emitter layer 57, and the base contact layer 58.

By adopting the structure described above, in the present invention, the n-type impurity concentration on the surface portion of the n-type active layer 103 around the p-type emitter layer 107 becomes low as compared with the conventional technology. As a consequence, an emitter current (a hole current) comes to flow in a portion in the vicinity of the surface of the n-type active layer 103. Thus, even in the case where an inversion layer is formed at the interface between the n-type active layer 103 and the buried oxide film 102, the emitter current which flows via this inversion layer is suppressed with the result that the emitter current is allowed to flow on the surface side of the n-type active layer 103.

As has been described above, according to the present invention, the resistance to the emitter current in the inversion layer is prevented from remarkably lowering as a result of the flowing of the hole current via the inversion layer. Consequently, the problem that the characteristic of hFE depends on the potential of the semiconductor substrate can be suppressed.

Figure 3:
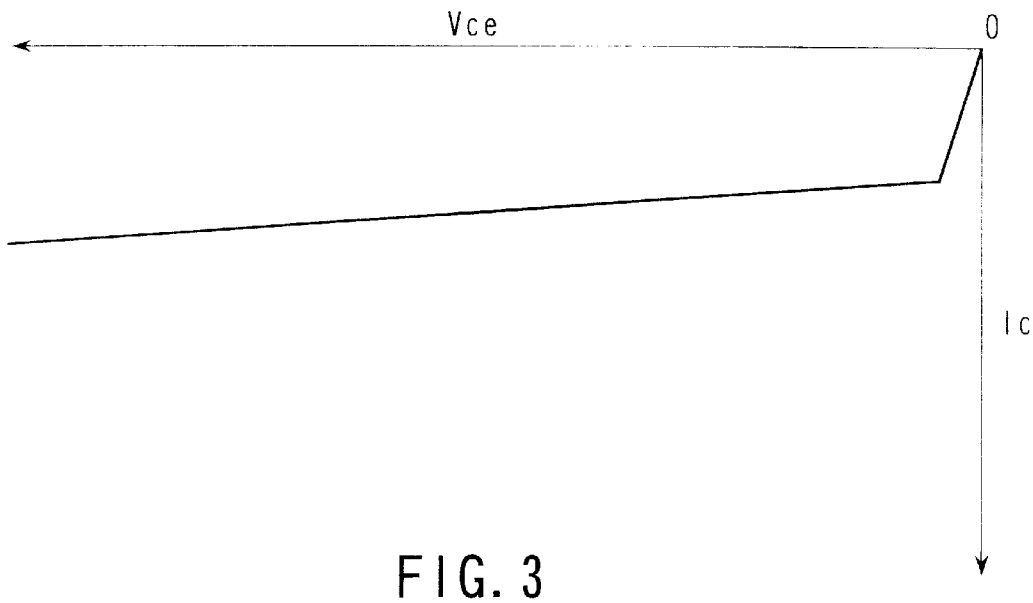
FIG. 3 is a characteristic diagram showing a relationship between the voltage between the collector and the emitter and the collector voltage in the semiconductor device of the present invention.
Figure 4:
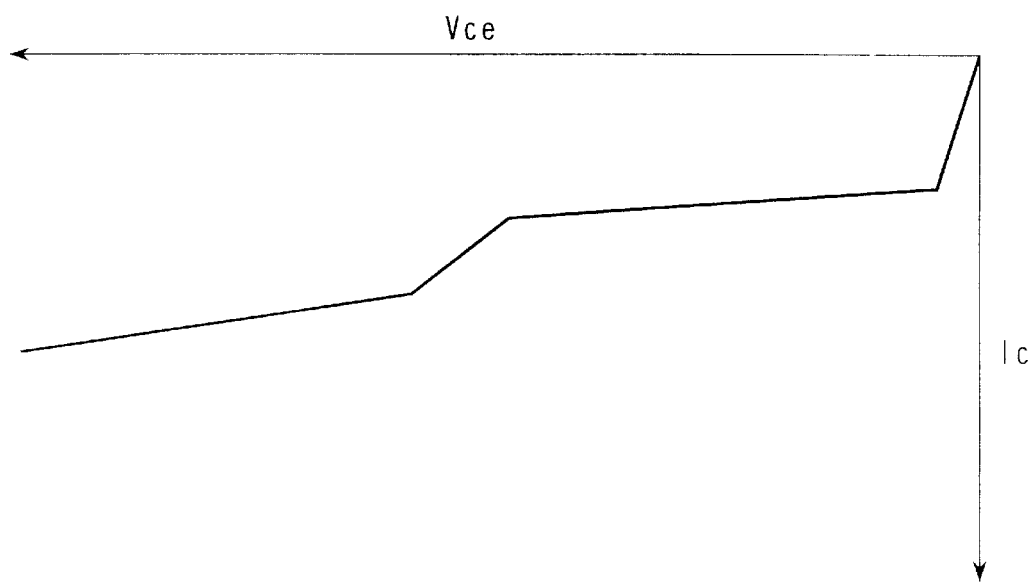
FIG. 4 is a characteristic diagram showing a relationship between the voltage between the emitter and the collector and the collector current in the conventional semiconductor device.

FIG. 3 is a characteristic diagram showing a relationship between the voltage between the collector and the emitter and the collector current in the lateral bipolar transistor of the present invention. Furthermore, FIG. 4 is a characteristic diagram showing a relationship between the voltage between the collector and the emitter and the collector current in the conventional lateral bipolar transistor shown in FIGS. 1A and 1B.

As shown in FIG. 3, in the lateral bipolar transistor of the present invention, the collector current shows a substantially constant value in the active region even with an increase in the voltage between the collector and the emitter. On the other hand, in the conventional lateral bipolar transistor, the collector current once shows a constant value in the active region with an increase in the voltage between the collector and the emitter. A further increase in the voltage between the collector and the emitter induces a further increase in the collector current at a certain voltage to make a kink.

It is considered that the reason why the collector current in the active region is increased in the conventional lateral bipolar transistor specifically results from the following phenomenon. In other words, when the portion of the n-type active layer 53 becomes thinner (the SOI layer becomes thinner), the emitter current (the hole current) is made easy to flow via the p-type inversion layer formed on the interface surface of the n-type active layer 53 with the buried oxide film 52. Furthermore, with an increase in the voltage between the collector and the emitter, a depletion layer is expanded from the side of the p-type collector layer 59 and is also expanded from the side of the buried oxide film 52. When the depletion layer is expanded in this manner, an effective base width is abruptly reduced and the current amplification ratio hFE increases. As a consequence, the collector current is abruptly increased, and a kink in the current curve in the active region in FIG. 4 is generated at a voltage between the collector and the emitter.

On the other hand, in the lateral bipolar transistor according to the present invention, as has been described above, the emitter current (the hole current) flows in a portion in the vicinity of the surface of the n-type active layer 103 with the result that the emitter current can be suppressed with respect to a portion thereof which flows via the inversion layer generated at the interface of the n-type active layer 103 with the buried oxide film 102. Consequently, the change in the effective base width due to the expansion of the depletion layer is reduced, so that the collector current in the active region becomes constant even when the voltage between the collector and the emitter increases.

Incidentally, the phenomenon described above becomes conspicuous when the portion of the n-type active layer 103 becomes thin (the SOI layer becomes thin) to 10 μm or less. In particular, in the case where the collector layer is formed in such a manner that the layer completely surrounds the circumference of the emitter layer (for example, FIG. 1A), the depletion layers expanded from the collector layer and the semiconductor layer toward the inversion layer formed on a portion immediately under the emitter layer are connected to each other, with the result that the effect of the shielding of the emitter current which flows through the inversion layer increases. In such a case, the problem that the characteristic of the collector current in the active region is deteriorated owing to a decrease in the effective base width is serious. According to the present invention, it is possible to keep in a favorable state the characteristic of the collector current in the active region in this case.

SECOND EMBODIMENT

Figure 5A:
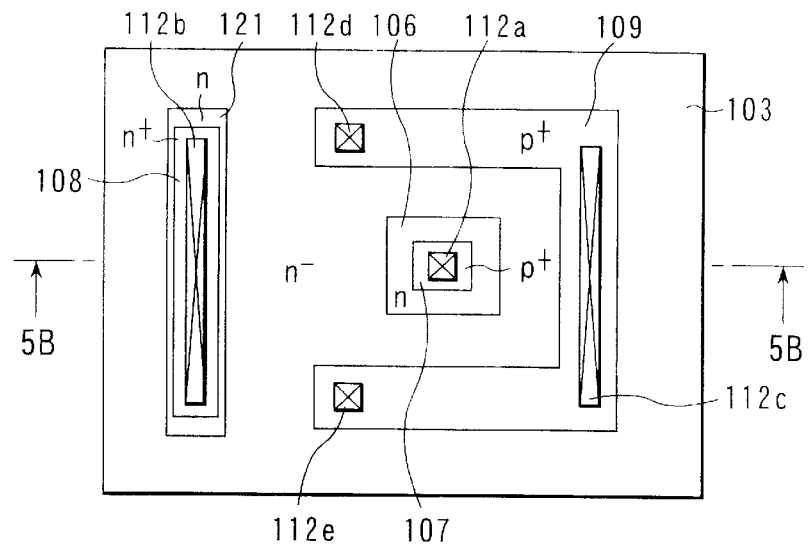
FIG. 5A is a plan view of the semiconductor device according to a second embodiment of the present invention.
Figure 5B:
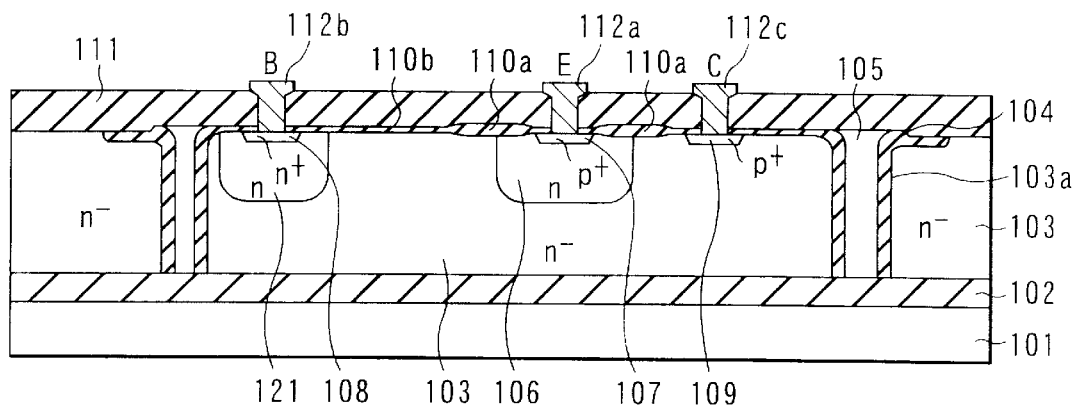
FIG. 5B is a sectional view taken along the line 5B—5B of FIG. 5A.

FIGS. 5A and 5B are views showing a structure of the semiconductor device according to a second embodiment of the present invention. Incidentally, the sectional view which passes through the collector electrode 112d, the emitter electrode 112a and the collector electrode 112e in FIG. 5A is omitted because the sectional view becomes the same as the FIG. 2C. Furthermore, like portions of FIGS. 2A through 2C are denoted by like reference numerals. The detailed explanation thereof is omitted here.

A characteristic portion in the second embodiment lies in the fact that the n-type diffusion layer 121 is formed on the circumference of the n-type base contact layer 108. Specifically, the n-type diffusion layer 121 is selectively formed on the surface of the n-type active layer 103 in separation from the n-type diffusion layer 106. The n-type base contact layer 108 is selectively formed on the surface of this n-type diffusion layer 121.

With such a structure, the same effect as the first embodiment can be obtained, and the base resistance between the n-type base contact layer 108 and the p-type emitter layer 107 can be effectively lowered. In such a structure, since it is possible to form the n-type diffusion layer 121 at the same time with the step of forming the n-type diffusion layer 106, the characteristic of the collector current in the active region can be improved without increasing the number of process steps, and it is also possible to reduce the base resistance.

THIRD EMBODIMENT

Figure 6A:
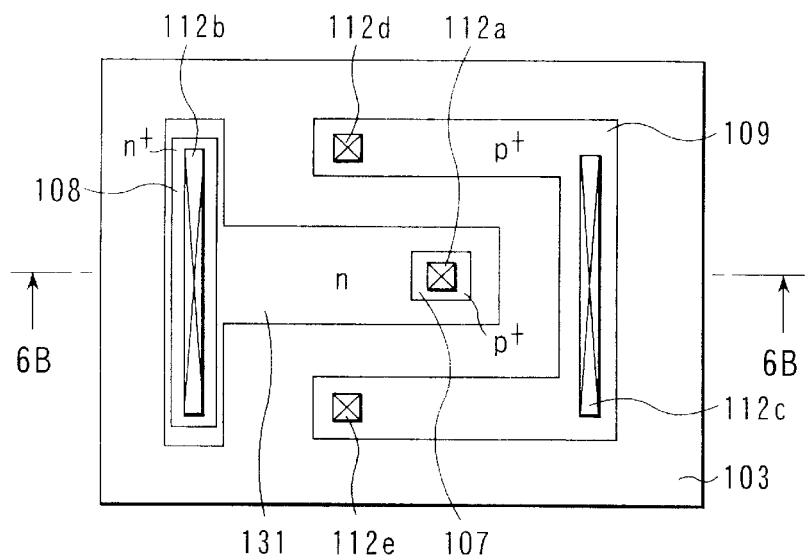
FIG. 6A is a plan view of the semiconductor device according to a third embodiment of the present invention.
Figure 6B:
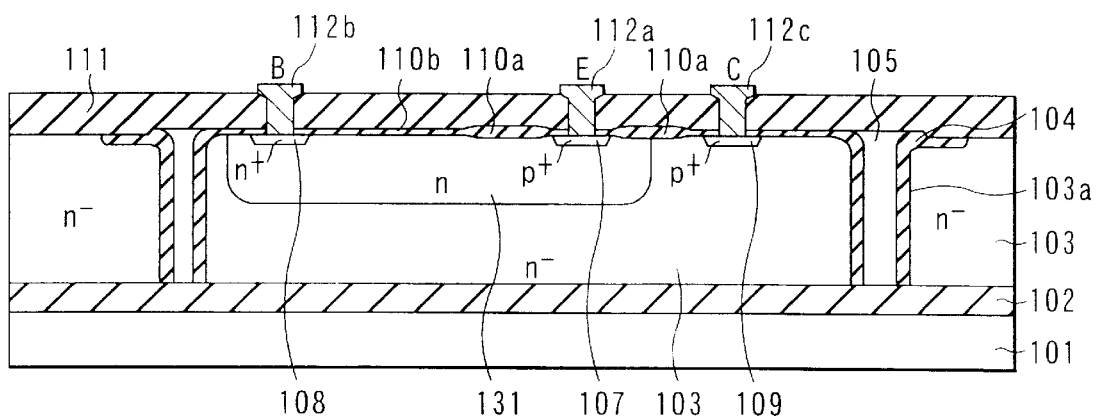
FIG. 6B is a sectional view taken along the line 6A—6B of FIG. 6A.

FIGS. 6A and 6B are views showing a structure of the semiconductor device according to a third embodiment of the present invention. Incidentally, the sectional view which passes through the collector electrode 112$d$, the emitter electrode 112$a$, and the collector electrode 112$e$ in FIG. 6A is omitted because the sectional view becomes the same as FIG. 2C. Furthermore, like portions of FIGS. 2A through 2C are denoted by like reference numerals. The detailed explanation thereof is omitted.

A characteristic portion in the third embodiment lies in the fact that the n-type diffusion layer 131 is formed in such a manner that the n-type base contact layer 108 and the p-type emitter layer 107 are included therein. Specifically, it is constituted in such a manner that the n-type diffusion layer 131 is selectively formed on the surface of the n-type active layer 103. On the surface of this n-type diffusion layer 131, the n-type base contact layer 108 and the p-type emitter layer 107 are selectively formed. The pattern configuration of the n-type diffusion layer 131 is formed in a T-like configuration. The p-type collector layer 109 is selectively formed on the surface of the n-type active layer 103 in separation from the n-type diffusion layer 131 thus formed.

In such a structure, the n-type base contact layer 108 is connected to the p-type emitter layer 107 via the n-type diffusion layer 131. As a consequence, the third embodiment can provide the same advantage as the first embodiment. Furthermore, it becomes possible to effectively lower the base resistance between the n-type base contact layer 108 and the p-type emitter layer 107. In such a structure, it becomes possible to improve the characteristic of the collector current in the active region and to decrease the base resistance easily without increasing the number of process steps only by the formation of the n-type diffusion layer 131.

In the above first to third embodiments, it is preferable that the depth of the semiconductor region of the first conductivity type (n-type diffusion layers 106, 121 and 131) is set to 1 $\mu$m or more and is typically set to 5 $\mu$m in order to obtain the advantage of the present invention. Besides, it is preferable that the surface impurity concentration of the semiconductor region of the first conductivity type is $5 \times 10^{15}$ cm$^{-3}$ or more and $5 \times 10^{16}$ cm$^{-3}$ or less. That is because it becomes difficult to obtain the advantage of the present invention when the concentration is lower than $5 \times 10^{15}$ cm$^{-3}$. On the contrary, the breakdown voltage is deteriorated when the concentration is higher than $5 \times 10^{15}$ cm$^{-3}$. Furthermore, the present invention is particularly effective when applied to the semiconductor device in which the breakdown voltage between the emitter region and the collector region is 10V or more and 80V or less.

Furthermore, the present invention is not limited to the above-described embodiment. For example, in the embodiment, the depth of the semiconductor region of the first conductivity type is smaller than the thickness of the active layer of the first conductivity type. The structure is not restricted thereto. The structure may be such that the semiconductor region of the first conductivity type contacts the buried insulation film.

Figure 1B:
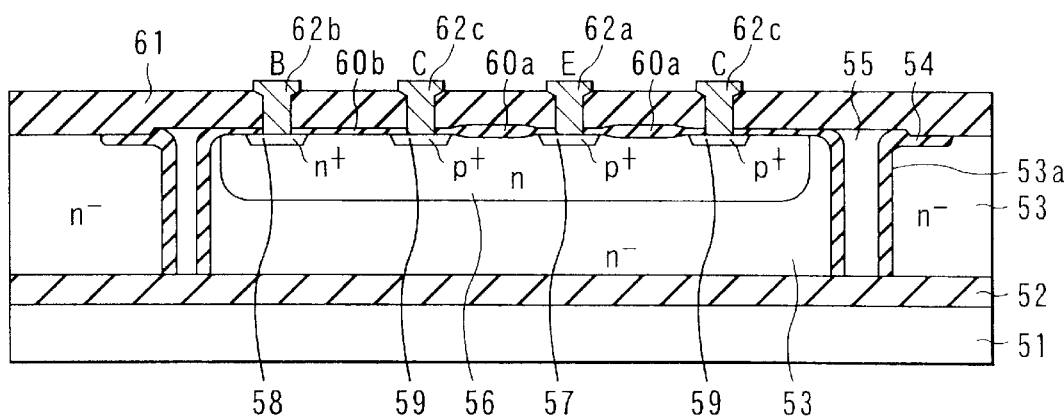
FIG. 1B is a sectional view taken along the line 1B—1B of FIG. 1A.

Although the emitter region is surrounded by the collector region excluding a portion between the base contact layer and the emitter region in this embodiment, it is possible to adopt a structure in which the emitter region is completely surrounded by the collector region, as shown in FIG. 1A.

According to the first to third embodiments of the present invention, the emitter current flows on surface side of the element. Since the emitter current is not affected by the inversion layer formed on the interface of the semiconductor layer with the buried insulation film, so that it becomes possible to provide a favorable high voltage bipolar transistor.

FOURTH EMBODIMENT

Figure 7A:
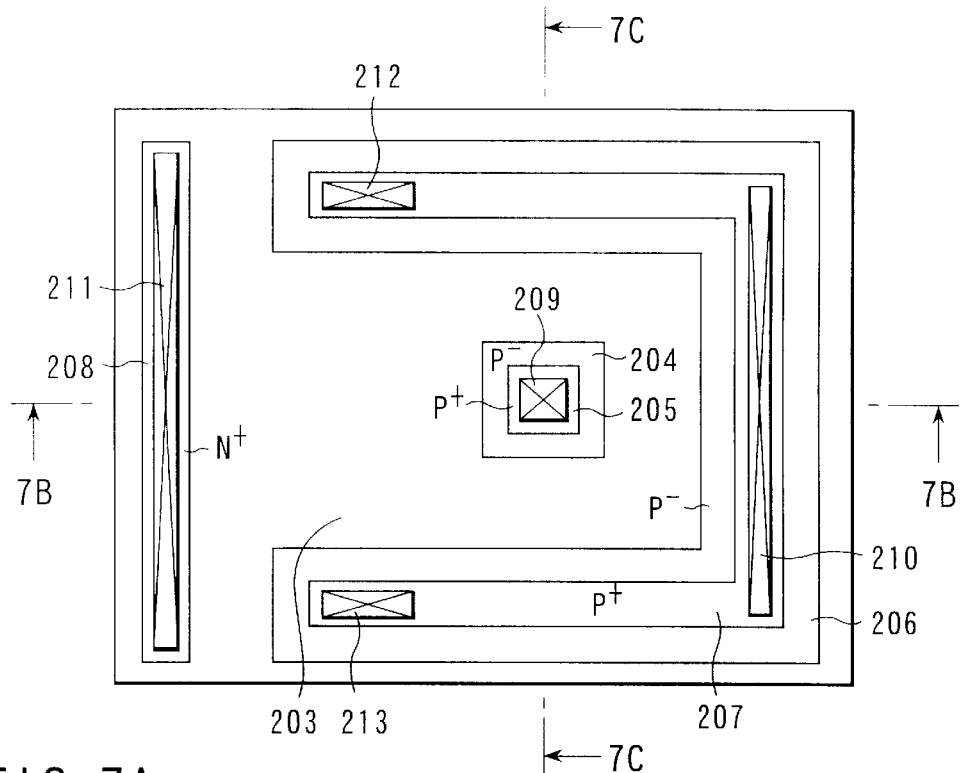
FIG. 7A is a plan view of the semiconductor device according to a fourth embodiment of the present invention.
Figure 7B:
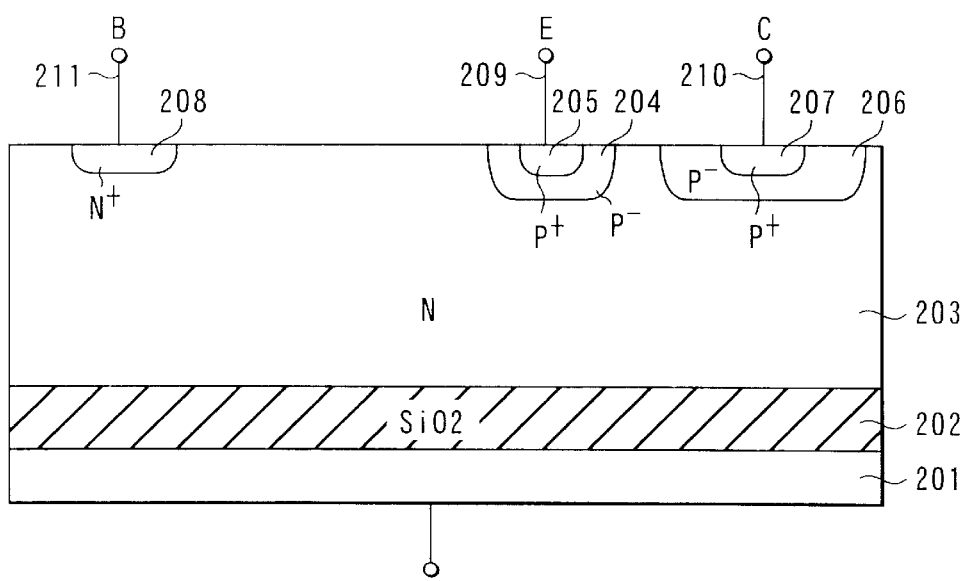
FIG. 7B is a sectional view taken along the line 7B—7B of FIG. 7A.

FIGS. 7A through 7C are views showing a structure of a semiconductor device according to a fourth embodiment of the present invention.

As shown in FIGS. 7A through 7C, in the fourth embodiment, a pnp-type lateral bipolar transistor is shown. In the beginning, on the semiconductor substrate 201, an insulation film 202 comprising a silicon oxide film is formed. On the insulation film 202, an n-type semiconductor layer 203 is formed. On the surface of this n-type semiconductor layer 203, a p$^+$-type emitter region 205 is formed. On the surface of the n-type semiconductor layer 203, a p$^+$-type collector layer 207 is formed so as to surround the p$^+$-type emitter region 205.

Furthermore, on the surface of the n-type semiconductor layer 203, an n$^+$-type base contact layer 208 is formed in separation from the p$^+$-type emitter region 205 and the p$^+$-type collector region 207. The n-type semiconductor layer 203 between the p$^+$-type emitter region 205 and the p$^+$-type collector region 207 functions as a base region. The p$^+$-type collector region 207 is formed in such a manner that the region 207 surrounds the p$^+$-type emitter region 205 excluding a portion between the n$^+$-type base contact region 208 and the P$^+$-type emitter region 205.

In this manner, in a region between the n$^+$-type base contact region 208 and p$^+$-type emitter region 205, the p$^+$-type collector region 207 is not formed for the following reasons. The base current from the n$^+$-type contact region 208 to the n$^+$-type semiconductor layer 203 sandwiched between the emitter region 205 and the collector region 207 are not affected by the depletion layer expanded from the P$^+$-type collector region 207 with the result that the base current having a sufficient value can be obtained. Such a structure is effective even with a normal semiconductor substrate. However, in the case of the SOI substrate, it is not necessary to provide the n$^+$-type buried region, and it is possible to secure sufficiently the base current in a simple structure.

Furthermore, as an important structure of the present invention, the p$^-$-type semiconductor region 206 is formed in a concentration lower than the concentration of the P$^+$-type collector region 207 on the circumference of the p$^+$-type collector region 207. This p$^-$-type semiconductor region 206 is formed in contact with the portion of the p+-type collector region 207 located opposite to the p+-type emitter region 205 and in separation from the p+-type emitter region 205.

Furthermore, in a similar manner, on the emitter side, a p−-type semiconductor region 204 is formed in a concentration lower than the concentration of the p+-type emitter region 205 on the circumference of the p+-type emitter region 205. This p−-type semiconductor region 204 is formed in contact with the portion of the p+-type emitter region 205 located opposed to the p+-type collector region 207 and in separation from the p+-type collector region 207.

On the p+-type emitter region 205, the p+-type collector region 207 and the n+-type base contact region 208, an emitter electrode 209, a collector electrode 210, and a base electrode 211 are provided, respectively. In FIGS. 7A through 7C, collector electrodes 212 and 213 are provided in addition to the collector electrode 210. These collector electrodes 212 and 213 serve to decrease the contact resistance.

As described above, in the lateral bipolar transistor according to the fourth embodiment of the present invention, a p−-type semiconductor regions 206 and 204 are formed as electric field relaxation layers on the p+-type collector region 207 and the p+-type emitter region 205, respectively. The impurity concentration of the n-type semiconductor layer 203 (the base region) between the p+-type emitter region 205 and the p+-type collector region 207 is set to a relatively high level.

In the lateral bipolar transistor having such a structure, since the impurity concentration of the base region is high, the depletion layer is primarily expanded into the p−-type semiconductor regions 206 and 204. Furthermore, since the electric field relaxation layers are formed for both of the collector region and the emitter region, the base width largely affecting the gain becomes a distance between the two electric field relaxation layers (the P−-type semiconductor regions 206 and 204). Consequently, the base width is not affected by the alignment precision of the masks, so that elements with small variations in the gain can be obtained. Besides, with the semiconductor device of the present invention, the high breakdown voltage can be obtained in the same principle with the Resurf used in the diode or the like.

FIG. 8 shows the result of the comparison between the semiconductor device according to the present invention and the conventional device with simulated characteristic values.

From FIG. 8, it can be seen that the structure of the present invention has been improved from the conventional structure in that the Early voltage has been improved from 21.3V to 51.6V and the breakdown voltage (Vceo) between the collector and the emitter has been also improved from 43.3V to 62.0V. Incidentally, the Early voltage refers to voltage value at the point where an abscissa intersects a straight line extended from a straight line portion of the collector current in the active region when the voltage between the collector and the emitter is assigned to an abscissa while the collector current assigned to an ordinate, as shown in FIG. 9.

In this case, the surface concentration of the impurity of each of the p+-type collector region 207 and the p+-type emitter region 205 is typically set to $1\times10^{17}$ cm$^{-3}$ or more, so that an ohmic contact is attainable in the respective regions.

Furthermore, it is desirable that the net dose of the impurity of the p−-type semiconductor regions 206 and 204 is set to $4.0\times10^{12}$ cm$^{-2}$ or less. In the case where the net dose is higher than $4.0\times10^{12}$ cm$^{-2}$, the p−-type semiconductor regions 206 and 204 are hard to be depleted with the result that it is difficult to provide a sufficient breakdown voltage.

Furthermore, with respect to the net dose of the impurity of the n-type semiconductor layer 203 (the base region) between the P+-type emitter region 205 and the p+-type collector region 207, the lower limit value thereof is determined with a trade-off of a punch-through voltage between the collector and the emitter and an Early voltage, whereas the upper limit value thereof is determined with the gain and the Vcbo (the emitter open breakdown voltage between a collector and a base, particularly, breakdown voltage immediately under the collector). For example, the net dose of the impurity of the p−type semiconductor regions 206 and 204 is set to $2.0\times10^{12}$ cm$^{-2}$ and the net dose of the impurity of the n-type semiconductor layer 203 (the base region) is set to $2.6\times10^{12}$ cm$^{-2}$. In this case, it is preferable that the net dose of the n-type semiconductor layer 203 is set to a level higher than that of the p−-type semiconductor regions 206 and 204. (The same is applied to other embodiments.)

Figure 10A:
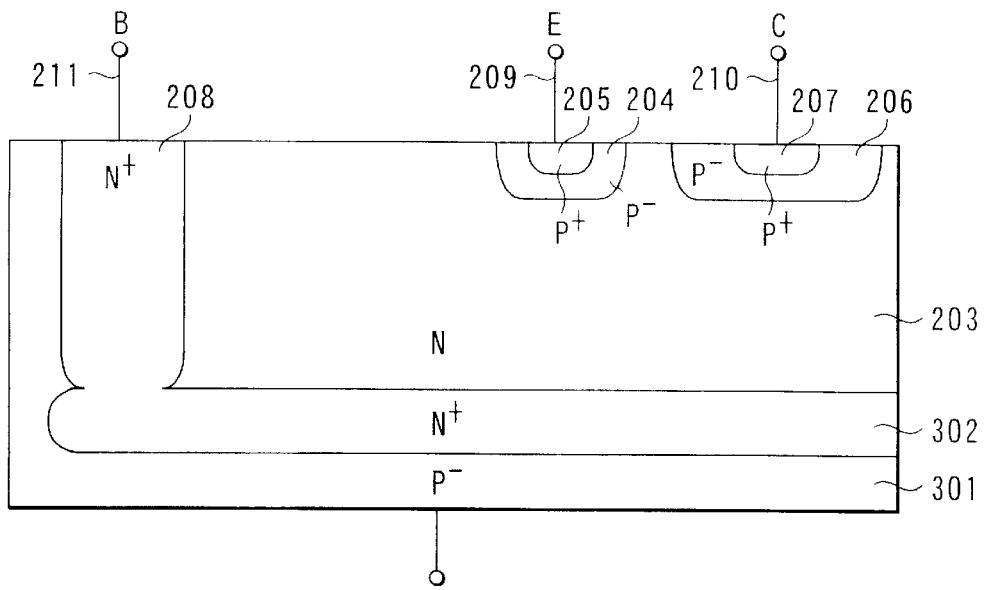
FIGS. 10A and 10B are sectional views of a variation of the fourth embodiment of the present invention, respectively corresponding to FIGS. 7A and 7B.
Figure 10B:
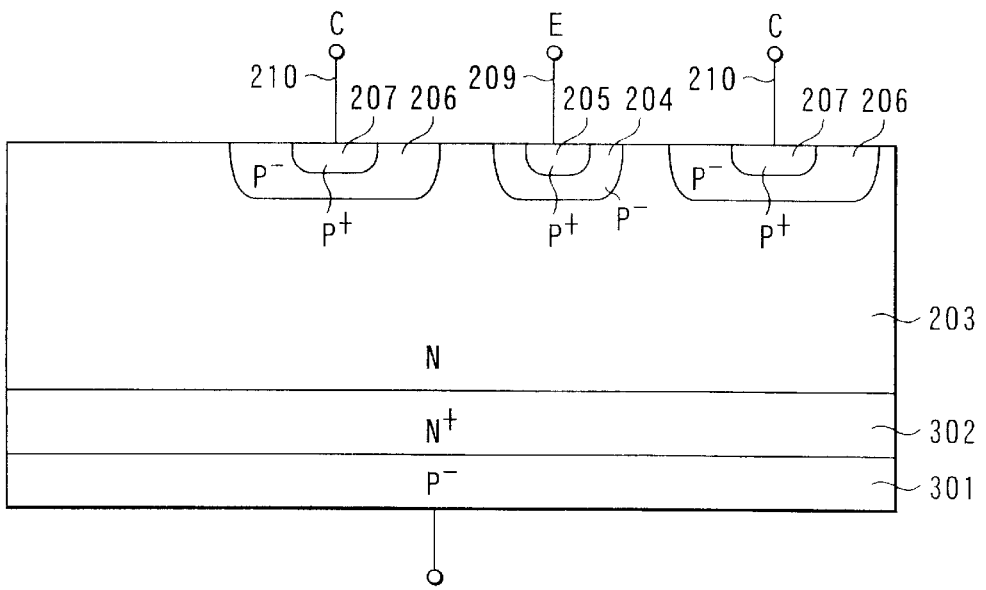

In the fourth embodiment, the bipolar transistor is formed on the SOI substrate, but the substrate is not limited to the SOI substrate. As shown in FIGS. 10A and 10B, a normal epitaxial substrate can be applied. FIGS. 10A and 10B are sectional views corresponding to FIGS. 7B and 7C, respectively. The base contact 208 is connected to the n+ buried layer 302 to lower the base resistance. The n+-buried layer is formed on the p−-type substrate 301, but the substrate may not be necessarily of p−-type.

FIFTH EMBODIMENT

Figure 11:
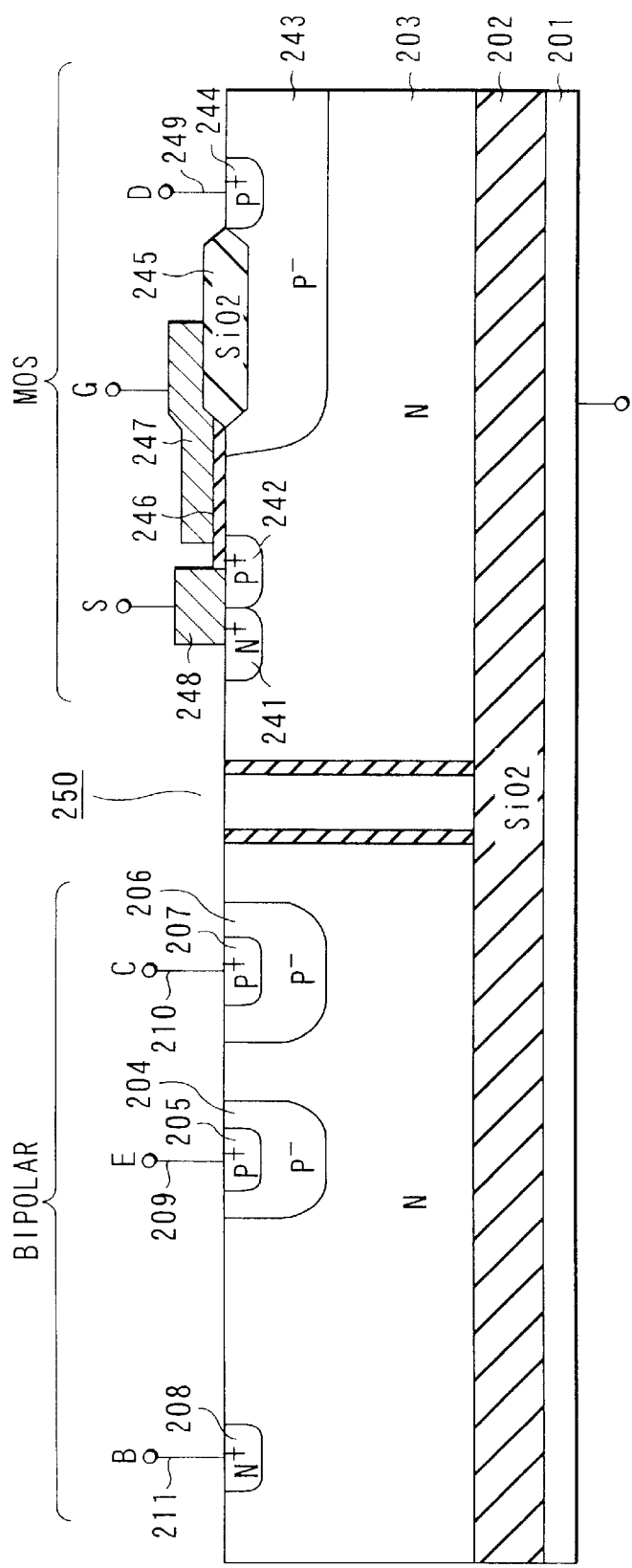
FIG. 11 is a sectional view of a semiconductor device according to a fifth embodiment of the present invention.

FIG. 11 is a sectional view for explaining a structure of a semiconductor device according to a fifth embodiment of the present invention. In the fifth embodiment, a double diffusion p-channel type lateral DMOSFET (LDMOSFET) (shown on the right side of FIG. 11) is formed on the same substrate with the PNP-type lateral bipolar transistor shown in the fourth embodiment.

As shown in FIG. 11, an insulation film 202 of silicon oxide is formed on the semiconductor substrate 201. On this insulation film 202, an n-type semiconductor layer 203 is formed. On the surface of this n-type semiconductor layer 203, the PNP-type lateral bipolar transistor shown in the fourth embodiment is formed on a first region (the left side) of the surface. On a second region (the right side) of the n-type semiconductor layer 203 which is insulated and isolated from the first region by the isolation region 250, a double diffusion p-type lateral DMOSFET shown hereinbelow is formed.

Specifically, on the surface (the second region) of the n-type semiconductor layer 203, the p+-type source region 242 is formed. Adjacent to this p+-type source region 242, on the surface of the n-type semiconductor layer 203, the n+-type contact region 241 is formed. Furthermore, in separation from the p+-type source region 242, the p−-type semiconductor region 243 is formed on the surface of the n-type semiconductor layer 203. On the surface of this p−-type semiconductor region 243, the p+-type drain region 244 is selectively formed.

On the surface of the n-type semiconductor layer 203 between the p−-type semiconductor region 243 and the p+-type source region 242, a gate electrode 247 is formed via a gate insulation film 246. Furthermore, a LOCOS film 245 is selectively formed including the surface of the p−-type semiconductor region 243 between the p+-type drain region 244 and n-type semiconductor region 203. This silicon oxide film 245 functions to relax an electric field at the end of the gate electrode 247 on the drain side. The gate electrode 247 is formed to extend onto the silicon oxide film 245.

On the p$^+$-type source region 242 and the n$^+$-type contact region 241, a source electrode 248 is formed, and on the p$^+$-type drain region 244, a drain electrode 249 is formed, respectively.

As described above, in the fifth embodiment, the p-channel type lateral MOSFET and the PNP-type lateral bipolar transistor shown in the fourth embodiment are formed on the same SOI substrate. According to the fifth embodiment, since it becomes possible to form the p$^-$-type semiconductor region 243 of the p-channel lateral MOSFEET and the p$^-$-type semiconductor regions 204 and 206 of the PNP-type lateral bipolar transistor in the same step, with the result that the p$^-$-type semiconductor region 243 of the p-channel type lateral MOSFET can be formed in a simple step without forming the two semiconductor regions in separate steps.

In FIG. 11, the electric field relaxation layer (the p$^-$-type semiconductor region 243) in a double diffusion p-channel type lateral MOSFET drift region maintains the breakdown voltage in the same principle with the PNP-type lateral bipolar transistor shown in the fourth embodiment, so that the specification can be shared. However, the function of the electric field relaxation layer of the lateral bipolar transistor serves only to relax the electric field on the surface, whereas the electric field relaxation layer of the double diffusion MOSFET allows the current to flow in addition to the above function. Consequently, in the case of the double diffusion MOSFET, it is required that the electric field relaxation layer (p$^-$-type semiconductor region 243) has a low resistance.

With the Resurf principle, p$^-$-type semiconductor region 243 can be easily depleted by the n-type semiconductor layer 203 under the p$^-$-type semiconductor region 243 in the off state. Consequently, the net dose of the impurity of this electric field relaxation layer is about $2 \times 10^{12}$ cm$^{-2}$ and can be increased to about $4 \times 10^{12}$ cm$^{-2}$ at most as for the MOSFET with low breakdown voltage, with the result that a low resistance can be realized while holding breakdown voltage. Consequently, in order to form a lateral bipolar transistor having a high Early voltage and a double diffusion MOSFET having a low on resistance on the same semiconductor substrate, the net dose of the impurity is suitably within a range from $1 \times 10^{12}$ cm$^{-2}$ to $4 \times 10^{12}$ cm$^{-2}$, preferably $2 \times 10^{12}$ cm$^{-2}$.

In this manner, the PNP-type lateral bipolar transistor having a high Early voltage and a p-channel type lateral DMOSFET having a low ON resistance can be formed on the semiconductor substrate without increasing the steps.

It is to be noted that, in the fourth and the fifth embodiment, the p$^-$-type semiconductor region is formed on the collector region and the emitter region, respectively, as an electric field relaxation layer. Such embodiments are preferable, but the advantage of the present invention can be attained by providing the electric field relaxation layer only on the collector region.

Besides, the electric field relaxation layer is provided also between the collector region and the base contact region and between the emitter region and the base contact region. This is intended to produce Vcbo (emitter open breakdown voltage between a collector and a base), Vceo (base open breakdown voltage between a collector and an emitter), but it is not required to provide the electric field relaxation layer in such a region, depending on the breakdown voltage design.

Besides, in the fourth and the fifth embodiments, the p$^+$-type collector region 207 is formed to surround the p$^+$-type emitter region 205 excluding a portion between the n$^+$-type base contact region 208 and the p$^+$-type emitter region 205, but the invention is not limited to such a form. The present invention can be applied also to a structure in which the collector region completely surrounds the emitter region as shown in FIG. 1A. In such a case, under the n-type semiconductor layer 203 which serves as a base region (also under the p$^+$-type emitter region 205 and the p$^+$-type collector region 207), it is preferable that an n$^+$-type buried layer is provided and this n$^+$-type buried layer is connected to the n$^+$-type base contact region 208 through a deep diffusion layer. In the case where the n$^+$-type buried region is provided, the base current is supplied to the base region between the p$^+$-type emitter region 205 and p$^+$-type collector region 207 through this n$^+$-type buried region, so that a large quantity of base current can be supplied. In such a case as well, it is possible to sufficiently display the advantage of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate a surface of which is formed of an insulation region;
   a high resistance active layer of a first conductivity type formed on the surface of the substrate, the active layer serving as a base region;
   a semiconductor region of the first conductivity type having an impurity concentration higher than that of the active layer of the first conductivity type and selectively formed on a surface of the active layer of the first conductivity type;
   an emitter region of a second conductivity type selectively formed on the semiconductor region of the first conductivity type;
   a collector region of the second conductivity type selectively formed on the surface of the active layer of the first conductivity type in separation from and around the semiconductor region of the first conductivity type, the collector region having a substantial U-shape; and
   a base contact region of the first conductivity type selectively formed on the surface of the active layer of the first conductivity type in separation from the emitter region and the collector region, and formed outside of a forming area of the collector region, an opening portion of the U-shape of the collector region being directed to the base contact region.

2. The semiconductor device according to claim 1, wherein a depth of the semiconductor region of the first conductivity type is smaller than a thickness of the active layer of the first conductivity type.

3. A semiconductor device comprising:
   a substrate a surface of which is formed of an insulation region;
   a high resistance active layer of a first conductivity type formed on the surface of the substrate, the active layer serving as a base region;
   a first semiconductor region of the first conductivity type having an impurity concentration higher than that of the active layer of the first conductivity type and selectively formed on a surface of the active layer of the first conductivity type;

an emitter region of a second conductivity type selectively formed on the surface of the first semiconductor region of the first conductivity type;

a collector region of the second conductivity type selectively formed on the surface of the active layer of the first conductivity type in separation from and around the first semiconductor region of the first conductivity type, the collector region having a substantial U-shape;

a second semiconductor region of the first conductivity type having an impurity concentration higher than that of the active layer of the first conductivity type, and formed on the active layer of the first conductivity type in separation from the semiconductor region of the first conductivity type, and formed outside of a forming area of the collector region; and a base contact region of the first conductivity type selectively formed on the surface of the second semiconductor region of the first conductivity type, an opening portion of the U-shape of the collector region being directed to the base contact region.

4. The semiconductor device according to claim 3, wherein a depth of the first and the second semiconductor region of the first conductivity type is smaller than a thickness of the active layer of the first conductivity type.

5. The semiconductor device according to claim 3, wherein the first semiconductor region of the first conductivity type and the second semiconductor region of the first conductivity type are constituted substantially in the same depth and substantially in the same impurity concentration.

6. A semiconductor device comprising:

a substrate a surface of which is formed of an insulation region;

a high resistance active layer of a first conductivity type formed on the surface of the substrate, the active layer serving as a base region;

a semiconductor region of the first conductivity type having an impurity concentration higher than that of the active layer of the first conductivity type and selectively formed on a surface of the active layer of the first conductivity type;

an emitter region of a second conductivity type and a base contact region of a first conductivity type formed in separation from each other on the surface of the semiconductor layer of the first conductivity type;

a collector region of the second conductivity type selectively formed on the surface of the active layer of the first conductivity type in separation from and around the semiconductor region of the first conductivity type, the collector region having a substantial U-shape and an opening of the U-shape being directed to the base contact region which is formed outside of a forming area of the collector region.

7. The semiconductor device according to claim 6, wherein a depth of the semiconductor region of the first conductivity type is smaller than a thickness of the active layer of the first conductivity type.

8. A semiconductor device comprising:

a semiconductor region of a first conductivity type formed on a substrate and serving as a base region;

an emitter region of a second conductivity type and a collector region of the second conductivity type selectively formed on a surface of the semiconductor region in separation from each other;

a base contact region of a first conductivity type selectively formed on the surface of the semiconductor region of the first conductivity type in separation from the emitter region of the second conductivity type and the collector region of the second conductivity type;

a first semiconductor region of the second conductivity type having an impurity concentration lower than that of the collector region of the second conductivity type, and formed between the collector region of the second conductivity type and the emitter region of the second conductivity type in contact with the collector region of the second conductivity type in separation from the emitter region of the second conductivity type, and a second semiconductor region of the second conductivity type having an impurity concentration lower than that of the emitter region of the second conductivity type, and formed between the collector region of the second conductivity type and the emitter region of the second conductivity type in separation from the collector region of the second conductivity type and in contact with the emitter region of the second conductivity type.

9. The semiconductor device according to claim 8, wherein the first semiconductor region of the second conductivity type has a portion provided between the collector region of the second conductivity type and the base contact region of the first conductivity type, the portion being separated from the base contact region of the first conductivity type.

10. The semiconductor device according to claim 8, further comprising a second semiconductor region of the second conductivity type having an impurity concentration lower than that of the emitter region of the second conductivity type, and formed between the collector region of the second conductivity type and the emitter region of the second conductivity type in separation from the collector region of the second conductivity type and in contact with the emitter region of the second conductivity type.

11. The semiconductor device according to claim 8, wherein the second semiconductor region of the second conductivity type has a portion provided between the emitter region of the second conductivity type and the base contact region of the first conductivity type, the portion being separated from the base contact region of the first conductivity type.

12. The semiconductor device according to claim 8, wherein the semiconductor region of the first conductivity type is formed on the substrate via an insulation region.

13. A semiconductor device comprising:

a semiconductor region of a first conductivity type formed on a substrate and serving as a base region;

an emitter region of a second conductivity type and a collector region of the second conductivity type selectively formed on a surface of a semiconductor region in separation from each other;

a base contact region of the first conductivity type selectively formed on a surface of the semiconductor region of the first conductivity type in separation from the emitter region of the second conductivity type and the collector region of the second conductivity type; and a first semiconductor region of a second conductivity type having an impurity concentration lower than that of the collector region of the second conductivity type and formed in contact with a portion of the collector region of the second conductivity type located opposite to the emitter region of the second conductivity type and in separation from the emitter region of the second conductivity type, a second semiconductor region of the second conductivity type having an impurity concentration lower than that of the emitter region of the second conductivity type, and formed in contact with a portion of the emitter region of the second conductivity type located opposite to the collector region of the second conductivity type and in separation from the collector region of the second conductivity type.

14. The semiconductor device according to claim 13, wherein the first semiconductor region of the second conductivity type is formed on a portion of the collector region of the second conductivity type located opposite to the base contact region of the first conductivity type in contact with the portion, the first semiconductor region of the second conductivity type being separated from the base contact region of the first conductivity type.

15. The semiconductor device according to claim 13, further comprising a second semiconductor region of the second conductivity type having an impurity concentration lower than that of the emitter region of the second conductivity type, and formed in contact with a portion of the emitter region of the second conductivity type located opposite to the collector region of the second conductivity type and in separation from the collector region of the second conductivity type.

16. The semiconductor device according to claim 13, wherein the second semiconductor region of the second conductivity type is formed on a portion of the emitter region of the second conductivity type located opposite to the base contact region of the first conductivity type, the second semiconductor region being separated from the base contact region of the first conductive region.

17. The semiconductor device according to claim 13, wherein the collector region of the second conductivity type has a substantial U-shape and is formed so as to surround the emitter region of the second conductivity type, and an opening of the U-shape is directed to the base contact region of the first conductivity type which is formed outside of a forming area of the collector region.

18. The semiconductor device according to claim 13, wherein the semiconductor region of the first conductivity type is formed on the substrate via an insulation region.

19. A semiconductor device comprising:
a substrate a surface of which is formed of an insulation region;
a high resistance active layer of a first conductivity type formed on the surface of the substrate, the active layer serving as a base region;
a semiconductor region of the first conductivity type having an impurity concentration higher than that of the active layer and selectively formed on a surface of the active layer;
an emitter region of a second conductivity type formed on the semiconductor region;
a collector region of the second conductivity type formed on the surface of the active layer in separation from the semiconductor region; and
a base contact region of the first conductivity type formed on the surface of the active layer in a position opposite to the collector region with respect to the emitter region and in separation from the semiconductor region.

20. A semiconductor device comprising:
a substrate a surface of which is formed of an insulation region;
a high resistance active layer of a first conductivity type formed on the surface of the substrate, the active layer serving as a base region;
a first semiconductor region of the first conductivity type having an impurity concentration higher than that of the active layer and selectively formed on a surface of the active layer;
an emitter region of a second conductivity type formed on the surface of the first semiconductor region;
a collector region of the second conductivity type formed on the surface of the active layer in separation from the first semiconductor region;
a second semiconductor region of the first conductivity type having an impurity concentration higher than that of the active layer, and formed on the active layer in a position opposite to the collector region with respect to the first semiconductor region and in separation from the first semiconductor region; and
a base contact region of the first conductivity type formed on the surface of the second semiconductor region.

21. A semiconductor device comprising:
a substrate a surface of which is formed of an insulation region;
a high resistance active layer of a first conductivity type formed on the surface of the substrate, the active layer serving as a base region;
a semiconductor region of the first conductivity type having an impurity concentration higher than that of the active layer and selectively formed on a surface of the active layer;
an emitter region of a second conductivity type formed on the surface of the semiconductor layer;
a collector region of the second conductivity type formed on the surface of the active layer in separation from the semiconductor region,
a base contact region of a first conductivity type formed on the semiconductor region in separation from the emitter region and in a position opposite to the collector region with respect to the emitter region.

22. A semiconductor device comprising:
a semiconductor region of a first conductivity type formed on a substrate and serving as a base region;
an emitter region of a second conductivity type and a collector region of the second conductivity type selectively formed on a surface of the semiconductor region in separation from each other;
a base contact region of a first conductivity type selectively formed on the surface of the semiconductor region of the first conductivity type in separation from the emitter region of the second conductivity type and the collector region of the second conductivity type;
a first semiconductor region of the second conductivity type having an impurity concentration lower than that of the collector region of the second conductivity type, and formed between the collector region of the second conductivity type and the emitter region of the second conductivity type in contact with the collector region of the second conductivity type in separation from the emitter region of the second conductivity type,
an active region of the first conductivity type provided on the substrate on a portion other than the semiconductor region of the first conductivity type is formed;
a source region of the second conductivity type and a drain region of the second conductivity type selectively formed on a surface of the active region of the first conductivity type in separation from each other;
a third semiconductor region of the second conductivity type having an impurity concentration lower than that of the drain region of the second conductivity type, and formed in separation from the source region of the second conductivity type and in contact with the drain region of the second conductivity type, the third semiconductor region including a portion between the source region of the second conductivity type and the drain region of the second conductivity type; and a gate electrode formed on a surface of the active region of the first conductivity type sandwiched between the third semiconductor region of the second conductivity type and a source region of the second conductivity type via a gate insulation film.

23. A semiconductor device comprising:

a semiconductor region of a first conductivity type formed on a substrate and serving as a base region;

an emitter region of a second conductivity type and a collector region of the second conductivity type selectively formed on a surface of a semiconductor region in separation from each other;

a base contact region of the first conductivity type selectively formed on a surface of the semiconductor region of the first conductivity type in separation from the emitter region of the second conductivity type and the collector region of the second conductivity type;

a first semiconductor region of a second conductivity type having an impurity concentration lower than that of the collector region of the second conductivity type and formed in contact with a portion of the collector region of the second conductivity type located opposite to the emitter region of the second conductivity type and in separation from the emitter region of the second conductivity type, an active region of the first conductivity type provided on the substrate on a portion other than the semiconductor region of the first conductivity type is formed;

a source region of the second conductivity type and a drain region of the second conductivity type selectively formed in separation from each other on a surface of the active region of the first conductivity type;

a third semiconductor region of the second conductivity type having an impurity concentration lower than that of the drain region of the second conductivity type, and formed in separation from the source region of the second conductivity type and in contact with the drain region of the second conductivity type, the third semiconductor region including a portion between the source region of the second conductivity type and the drain region of the second conductivity type; and a gate electrode formed on a surface of the active region of the first conductivity type sandwiched between the third semiconductor region of the second conductivity type and the source region of the second conductivity type via a gate insulation film.

* * * * *